(12) United States Patent
Ker et al.

(10) Patent No.: US 6,388,850 B1
(45) Date of Patent: May 14, 2002

(54) GATE-COUPLED ESD PROTECTION CIRCUIT WITHOUT TRANSIENT LEAKAGE

(75) Inventors: Ming-Dou Ker; Chen-Chia Wang, both of Hsinchu; Hun-Hsien Chang, Taipei, all of (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/376,066

(22) Filed: Aug. 17, 1999

(30) Foreign Application Priority Data

Jan. 4, 1999 (TW) ........................................ 88100037 A

(51) Int. Cl.[7] ................................................. H02H 9/00
(52) U.S. Cl. ...................................................... 361/56
(58) Field of Search ........................... 361/56, 111, 119, 361/91.1

(56) References Cited

U.S. PATENT DOCUMENTS 5,600,525 A * 2/1997 Avery ........................... 361/56
5,917,689 A * 6/1999 English et al. ................. 361/56

* cited by examiner

Primary Examiner—Ronald W. Leja
(74) Attorney, Agent, or Firm—Nath & Associates PLLC; Harold L. Novick

(57) ABSTRACT

An apparatus of preventing integrated circuits from interfering by electrostatic-discharge (ESD), applied in an internal circuit and an input pad, both coupled with a first power line and a second power line, comprises a voltage clamp circuit and a voltage bias circuit. The voltage clamp circuit, with a transistor, connects to the second power line for clamping potential level through the voltage clamp circuit. The voltage bias circuit, with at least one diode coupled in series, connects to the voltage clamp circuit and the first power line for biasing the voltage clamp circuit to the second power line.

21 Claims, 13 Drawing Sheets

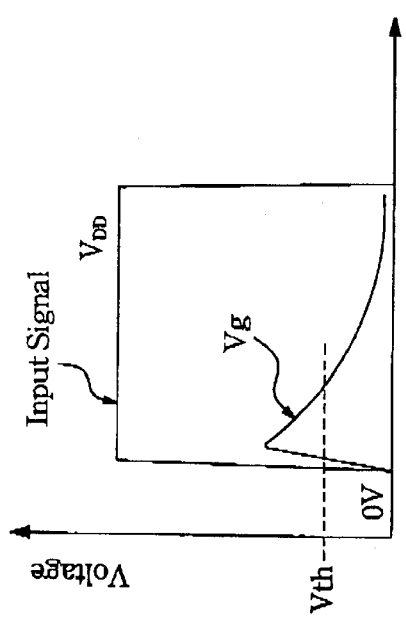
Fig. 5 (A) (PRIOR ART)
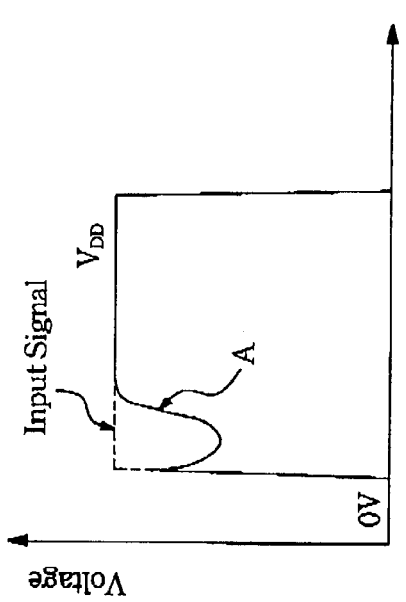
Fig. 5 (B) (PRIOR ART)
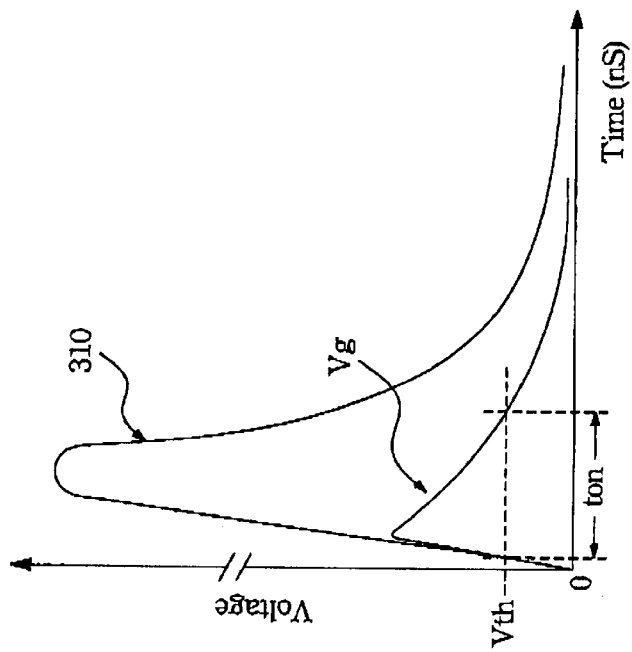
Fig. 3 (PRIOR ART)

GATE-COUPLED ESD PROTECTION CIRCUIT WITHOUT TRANSIENT LEAKAGE

FIELD OF THE INVENTION

The present invention relates to an ESD protecting circuit in integrated circuits, and more specifically, to an gate-coupled ESD protecting circuit without transient leakage in integrated circuits.

BACKGROUND OF THE INVENTION

The semiconductor industry has been advanced to the field of Ultra Large Scale Integrated (ULSI) technologies. As the size of the devices is scaled down, the ESD (electrostatic discharge) damage has become one of the main reliability concerns on the IC (integrated circuit) products. Especially, while the CMOS technology is developed into the deepsubmicron regime, the scaled-down MOS devices and thinner gate oxide become more vulnerable to ESD stress. For general industrial specification, the input and output pins of the IC products have to sustain the ESD stress of above 2000 Volts. Therefore, the ESD protection circuits have to be placed around the input and output pads of the IC's to protect the IC's against the ESD damage.

Please referring to FIG. 1, A typical input ESD protection circuit according to a prior art is shown. The ESD protection circuit includes a gate-grounded NMOS Mn1 with a larger device dimension for protecting the input circuits of the IC. The internal circuits 100 is protected by the ESD protective circuit. A power line $V_{DD}$ and a power line $V_{SS}$ are coupled to the internal circuits 100 and indicated as the power supplies of the internal circuits 100. An input pad 10 is coupled to the drain of the NMOS Mn1, and coupled to the internal circuits 100 through a resistor R. The gate and source of the NMOS Mn1 are coupled to the power line $V_{SS}$. In order to sustain a high ESD current, the gate-grounded NMOS (often called as GGNMOS) Mn1 in FIG. 1 is drawn with a huge device dimension, such as W/L=500/0.5 in a typical 0.35 μm CMOS technology. With such a huge device dimension, the GGNMOS Mn1 is typically drawn with 10-fingers poly gates [1]. However, the GGNMOS with a large layout area and a huge device dimension had been found that the GGNMOS just sustains a low ESD voltage, because the multiple poly gates of the GGNMOS can not be uniformly turned-on during the ESD stress [2]. Only few poly gates in the layout of the large-dimension GGNMOS are turned-on to bypass the ESD current, but most of the other poly gates still keep off during the ESD stress. Only few poly gates of the large-dimension GGNMOS are turned on to bypass the ESD current, therefore the large-dimension GGNMOS can only sustain a low ESD level. In order to improve the ESD level of such large-dimension GGNMOS, the multiple poly-gate fingers of the large-dimension GGNMOS have to be uniformly triggered on to share ESD-stress current. If all the poly gates of the large-dimension GGNMOS can be uniformly turned-on during the ESD-stress condition, the large dimension GGNMOS can sustain a much high ESD level [2].

[1] S. G. Beebe, "Methodology for layout design and optimization of ESD protection transistors," 1996 EOS/ESD Symp. Proc., pp. 265–275.

[2] T. L. Polgreen and A. Chatterjee, "Improving the ESD failure threshold of silicided NMOS output transistors by ensuring uniform current flow," IEEE Trans. Electron Devices, vol.39, pp. 379–388,1992.

To achieve the uniform turn-on behavior among the multiple poly-gate fingers of the large-dimension NMOS, a gate-coupled technique had been reported to improve the ESD level of the large-dimension NMOS [3]–[9]. The typical gate-coupled design for input ESD protection circuit is shown in FIG. 2, wherein a capacitor Cn is connected from the input pad 10 to the gate of the ESD protection NMOS Mn1, and the gate of the NMOS Mn1 is connected to the power line $V_{SS}$ through a resistor Rn. Such a gate-coupled NMOS Mn1 has been called as GCNMOS [5]–[7]. The capacitor Cn is used to couple the ESD transient voltage from the input pad 10 to the gate of the NMOS Mn1. With a coupled voltage on the gate of the NMOS Mn1, all the poly gates of the large-dimension NMOS can be uniformly turned on to bypass the ESD current. Therefore, the ESD level of the large-dimension NMOS can be effectively improved. To sustain the coupled voltage on the gate of the NMOS Mn1, the resistor Rn is added from the gate of NMOS Mn1 to $V_{SS}$. When the ESD-transient voltage is coupled through the Cn to the gate of NMOS Mn1, such coupled voltage held longer in time by the resistor Rn. So, the NMOS Mn1 can be efficiently triggered on to bypass the ESD current.

Please referring to FIG. 3, the operating waveforms in the time domain according to the traditional gate-coupled (GCNMOS)design are illustrated. The human-body-model ESD voltage pulse 310 has a rise time around 5–15 ns. While such ESD voltage pulse 310 is attached to the input pad 10, the rising edge of the ESD voltage pulse 310 generates the displacement current through the Cn (referring to FIG. 2) to the gate of the NMOS Mn1. The coupled voltage on the gate of the NMOS Mn1 will be discharged by the resistor Rn to $V_{SS}$. Therefore, the gate voltage Vg has a voltage waveform as shown in FIG. 3. The time period, when the Vg is greater than the threshold voltage (Vth) of the NMOS Mn1, is the turn-on time ($t_{on}$) of the GCNMOS. The larger Cn and larger Rn lead to a longer turn-on time of the GCNMOS in the ESD protection circuit [8]. So, the gate-couple technique can effectively improve the ESD level of the large-dimension NMOS in the ESD protection circuit.

An alternative design of the gate-coupled ESD protection circuit is shown in FIG. 4–[9], wherein the gate-coupled technique is applied to both the NMOS and PMOS devices in the input ESD protection circuit to achieve the uniformly turn-on behavior among the multiple fingers of the ESD-protection devices. The gate-coupled circuits about the PMOS devices are same as those of the NMOS devices. A capacitor Cp is connected from the input pad 10 to the gate of the ESD-protection PMOS Mp1, and the gate of the PMOS Mp1 is connected to the power line $V_{DD}$ through a resistor Rp. [3] C. Duvvury and R. N. Rountree, "Output buffer. with improved ESD protection," U.S. Pat. No. 4,855, 620, August 1989.

[4] C. D. Lien, "Electrostatic discharge protection circuit," U.S. Pat. No. 5,086,365, February 1992.

[5] C. Duvvury and C. Diaz, "Dynamic gate coupling of NMOS for efficient output ESD protection," Proc. of IRPS, 1992, pp.141–150.

[6] C. Duvvury, C. Diaz, and T. Haddock, "Achieving uniform NMOS device power distribution for submicron ESD reliability," in Tech. Dig. IEDM, 1992, pp.131–134.

[7] S. Ramaswamy, C. Duvvury, and S. M. Kang, "EOS/ESD reliability of deep sub-micron NMOS protection devices," in Proc. of IRPS, 1995, pp.284–291.

[8] M. D. Ker, C. Y. Wu, T. Cheng, and H. H. Chang, "Capacitor-couple ESD protection circuit for deep-submicron low-voltage CMOS ASIC," IEEE Trans. on VLSI Systems, vol.4, pp.307–321, September 1996.

[9] M. D. Ker, C. Y. Wu, T. Cheng, C. N. Wu and T. L. Yu, "Capacitor-couple electrostatic discharge protection circuit," U.S. Pat. No. 5,631,793, May. 1997.

The gate-coupled design can improve the ESD level of the ESD-protection devices with large device dimensions. Referring to FIG. 3, the larger Cn will generate higher coupled voltage on the gate of the NMOS Mn1 to uniformly turn on the NMOS Mn1 to bypass ESD current. However, the NMOS Mn1 should be kept off when the IC is in the normal operating conditions. In the normal operating conditions, the input signal is applied to the input pad 10 from other IC's or circuits. The input signal may have a sharp rising edge for high-speed applications. For example, the rise time of the input signal may has a rise time of 1 ns for the input signal with 100 MHz operating frequency. For faster operating speed, the rise time of the input signal will become shorter. In such high-speed applications, the sharp rising edge (dV/dt) of the input signal may generate a displacement current of Ic=Cn×(dV/dt) through the Cn to the gate of the ESD-protection device NMOS Mn1. Thus, the gate voltage of the NMOS Mn1 in such high-speed applications may be coupled with a transient voltage greater than its threshold voltage.

Please referring to FIG. 5A, the typical voltage waveforms of the input signal and the coupled voltage on the gate of the NMOS Mn1 are shown. Because the gate of NMOS Mn1 is coupled with a transient voltage Vg greater than its threshold voltage Vth, the NMOS Mn1 is turned on and generates a leakage current path from the input pad 10 to the power line $V_{SS}$. Because the NMOS Mn1 is designed for ESD protection, such a NMOS Mn1 is drawn with a large device dimension to sustain the high ESD-current stress. The large-dimension NMOS Mn1 is turned on by the high-speed input signal with a sharp rising edge, so the input signal will be seriously degraded by the turned-on NMOS Mn1. A typical waveform of the input signal degraded due to the turned-on NMOS Mn1 is shown in FIG. 5B, wherein the sharp rising edge of the input signal is degraded by the leakage current through the NMOS Mn1. The recess curve A illustrates the degraded portion of the input signal.

The ESD-protection device NMOS Mn1 in the IC normal operating conditions should be kept off. However, using the gate-couple technique to improve the ESD level of the NMOS Mn1, the couple capacitor Cn is added to the gate of NMOS Mn1 to uniformly trigger on the large-dimension NMOS Mn1 for effective ESD protection. But, such an ESD-coupled capacitor Cn can also couple the input signal with sharp rising edge to turn on the NMOS Mn1 when the IC is in the normal operating conditions. The causes the input waveform with serious degradation. So The effective gate-couple design for ESD protection is not suitable for applying in the IC's with high-speed operations.

In this invention, a solution has been proposed to overcome the aforementioned problem in prior art. This invention proposes a practical solution to successfully and safely apply the gate-coupled technique for ESD protection in the IC's with high-speed input signals, but without causing the transient leakage in the ESD protection circuit when the IC's is in the normal operating conditions.

SUMMARY OF THE INVENTION

An apparatus of preventing integrated circuits from interfering by electrostatic-discharge (ESD) comprises an internal circuit coupled with the first power line and the second power line, and an input pad coupled to the internal circuit for inputting signals to the internal circuit. A first voltage clamp circuit is coupled to the first power line for clamp potential level through the first voltage clamp circuit. A first voltage bypass circuit is coupled to the first voltage clamp circuit and a second power line for biasing the first voltage clamp circuit to the second power line, wherein the first voltage bypass circuit and first voltage clamp circuit are both coupled with the internal circuit and coupled to the input pad. A second voltage clamp circuit is coupled to a second, power line for clamp potential level through the second voltage clamp circuit, and a second voltage bypass circuit is coupled to the second voltage clamp circuit and the first power line for biasing the second voltage clamp circuit to the first power line, wherein the second voltage bypass circuit and second voltage clamp circuit are both coupled with the input pad and coupled to the internal circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a schematic diagram of operating waveforms in the time domain according to the traditional gate-coupled design for input ESD protection circuit.

FIG. 5A is a schematic diagram of the typical voltage waveforms for the input signal and the coupled voltage on the gate of the NMOS in accordance with the prior art.

FIG. 5B is a schematic diagram of the typical voltage waveform of the input signal degraded due to the turned-on NMOS in accordance with the prior art.

DETAILED DESCRIPTION OF THE PREFERRED EMBODIMENT

In this invention, a gate-coupled ESD protection circuit without transient leakage has been proposed to solve the ESD protection issue of the IC with high-speed input signals. The practical gate-coupled ESD protection circuit according to present invention can successfully and safely apply the gate-coupled technique for ESD protection in the IC's with high-speed input signals, but without causing the transient leakage in the ESD protection circuit when the IC's is in the normal operating conditions.

Figure 1:
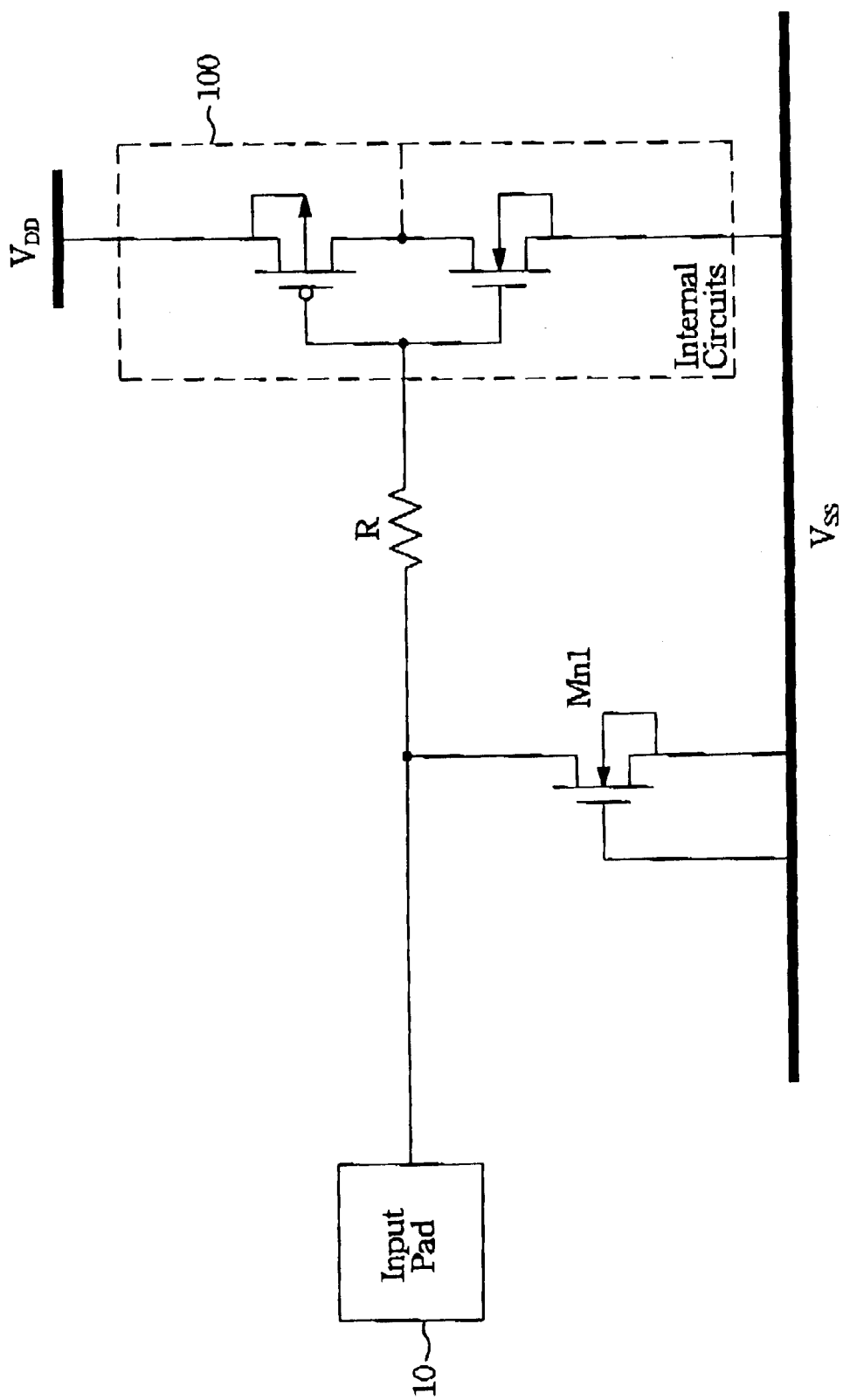
FIG. 1 is a schematic diagram of an input ESD protection circuit in accordance with the prior art.
Figure 2:
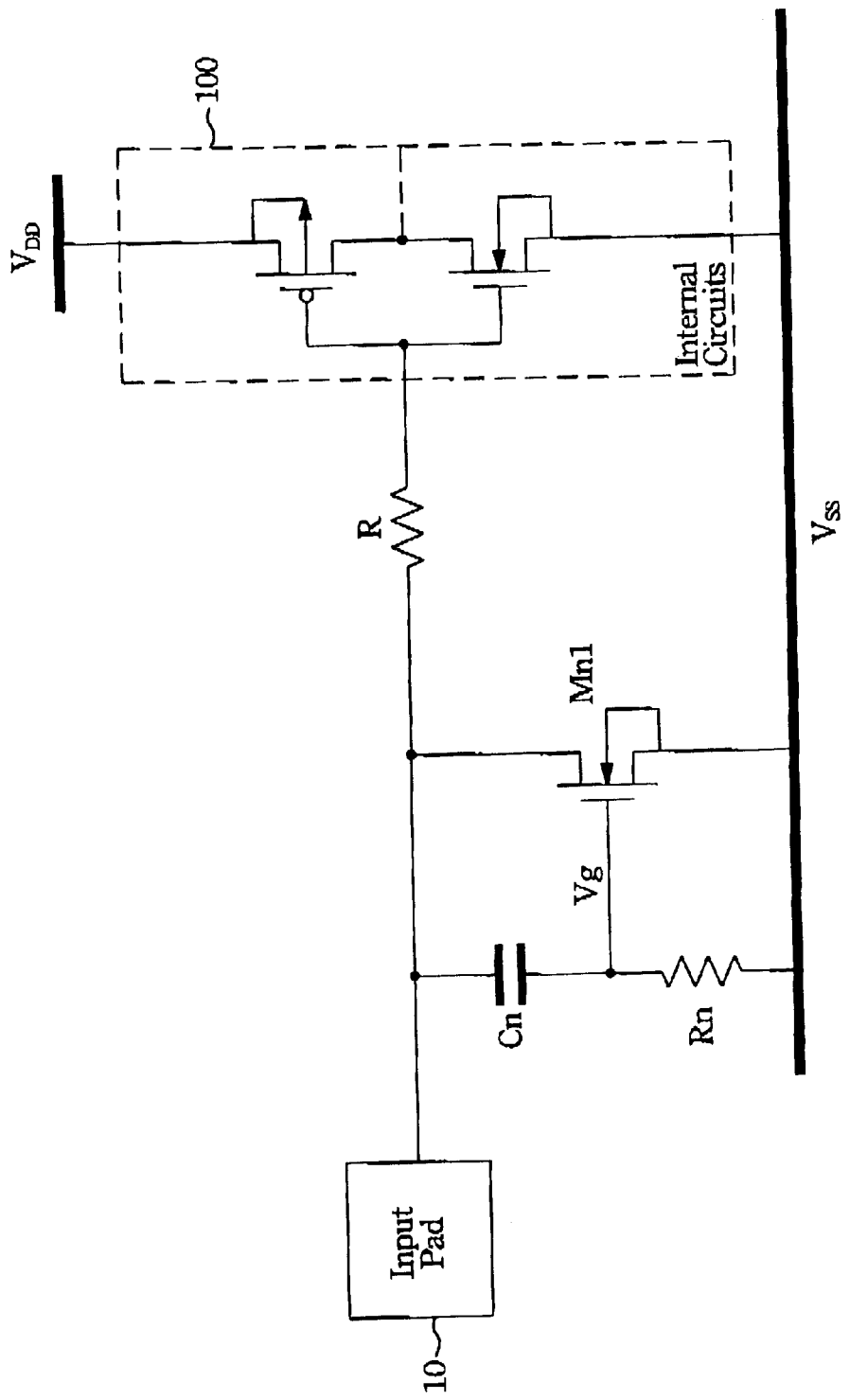
FIG. 2 is a schematic diagram of a typical gate-coupled design for input ESD protection circuit with the prior art.
Figure 4:
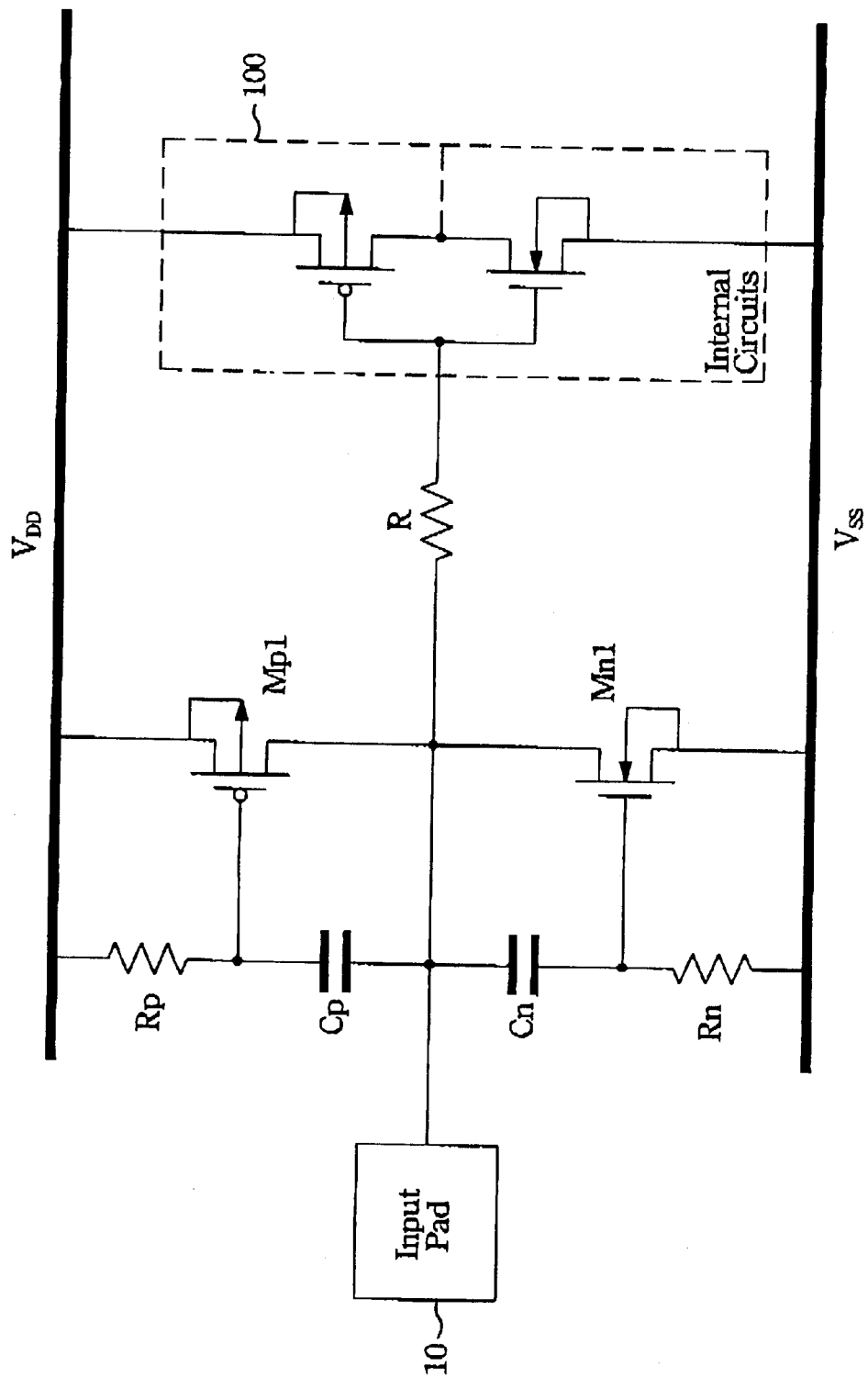
FIG. 4 is a schematic diagram of an alternative design of the gate-coupled ESD protection circuit in accordance with the prior art.
Figure 6:
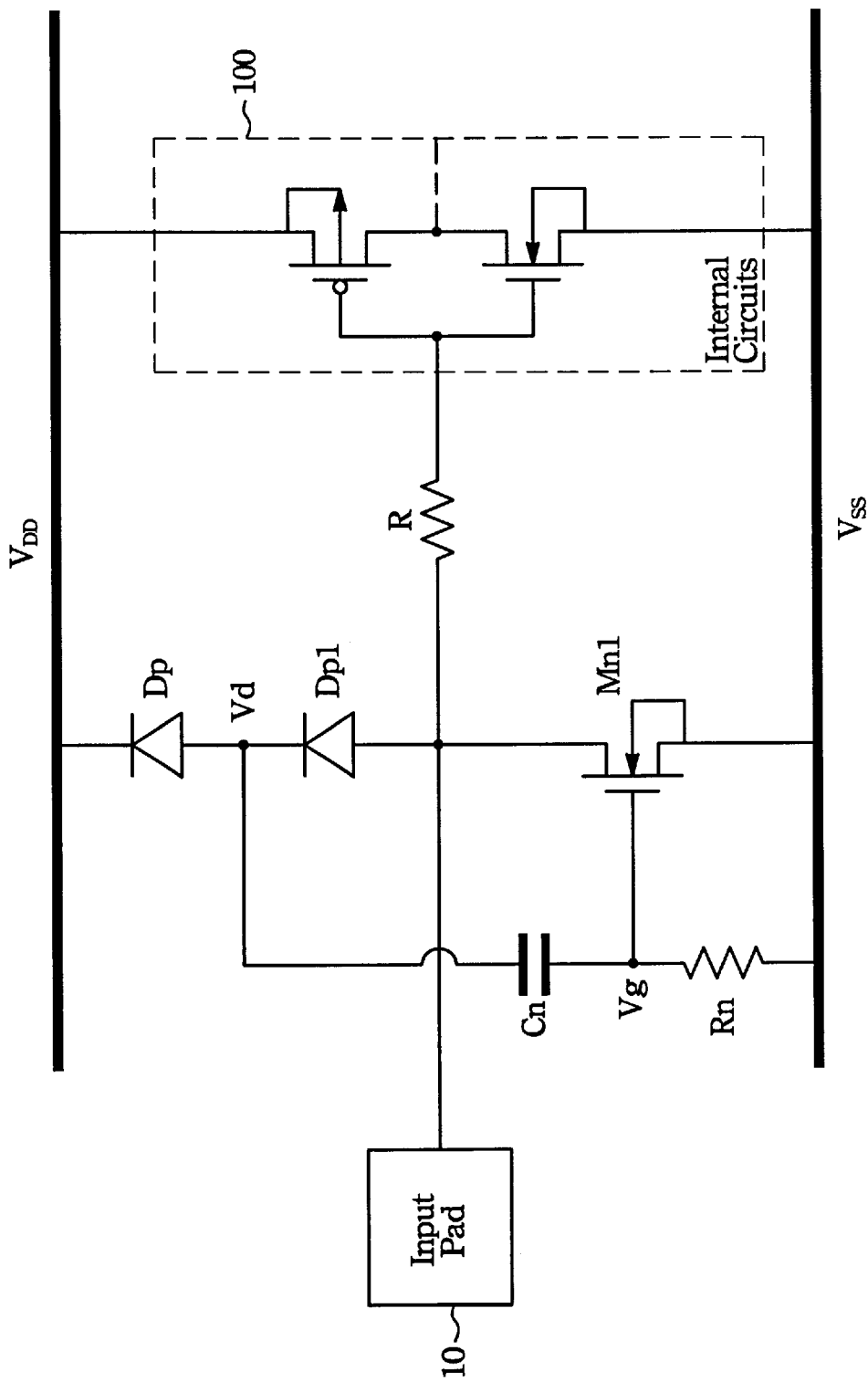
FIG. 6 is a schematic diagram of the gate-coupled ESD protection circuit without transient leakage in accordance with the present invention.

Please referring to FIG. 6, the gate-coupled ESD protection circuit without transient leakage according to present invention is shown. As comparing to the traditional gate-coupled design in FIG. 2, there are two extra diodes Dp and Dp1 used in the gate-coupled ESD design. An anode of the diode Dp1 is coupled to the drain of the NMOS Mn1, and the cathode of the Dp1 is coupled to the anode of the diode Dp, and coupled to the gate of the NMOS Mn1 through the capacitor Cn. The cathode of the diode Dp is coupled to the power line $V_{DD}$. The gate of the NMOS Mn1 is coupled to the power line $V_{SS}$ through the resistor Rn, and the source of the NMOS Mn1 is also coupled to the power line $V_{SS}$. Besides, the drain of the NMOS Mn1 is coupled to the internal circuits 100 through the resistor R, and coupled to the input pad 10. The internal circuits 100 is coupled to the power line $V_{DD}$ and the power line $V_{SS}$ for power supply. By using such arrangement, the sharp rising edge of the input signal from the input pad 10 can not directly access the coupled capacitor Cn, so the ESD-protection device NMOS Mn1 is not triggered on by the high-speed input signal with a sharp rising edge when the IC is in the normal operating conditions. But, in the ESD-stress conditions, the ESD voltage with a much higher voltage level can be diverted from the input pad 10 to $V_{DD}$ line through the diodes Dp and Dp1. Thus, the voltage level between the diodes Dp and Dp1 has an ESD voltage level similar to that on the input pad 10. Therefore, the gate of NMOS Mn1 can be still coupled with some ESD-transient voltage through the capacitor Cn to uniformly turn on the NMOS Mn1 to bypass the ESD current from the input pad 10 to the power line $V_{SS}$. By using this design, the gate-coupled technique can be still functioned to improve ESD level of the ESD protection circuit. But, when the IC is in the normal operating conditions with high-speed input signals, the sharp rising edge of the input signal does not trigger on the ESD-protection device NMOS Mn1.

Figure 7B:
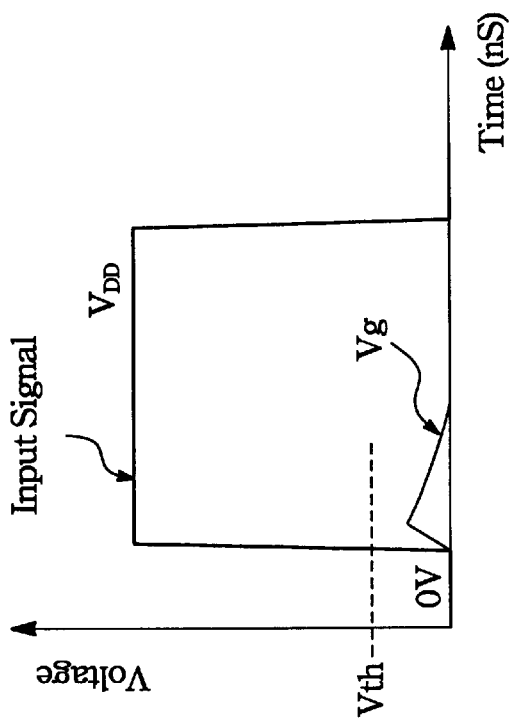
FIG. 7B is a schematic diagram of the typical voltage waveforms in the normal operating condition with high-speed input signal for the gate-coupled ESD protection circuit in accordance with the present invention.
Figure 7A:
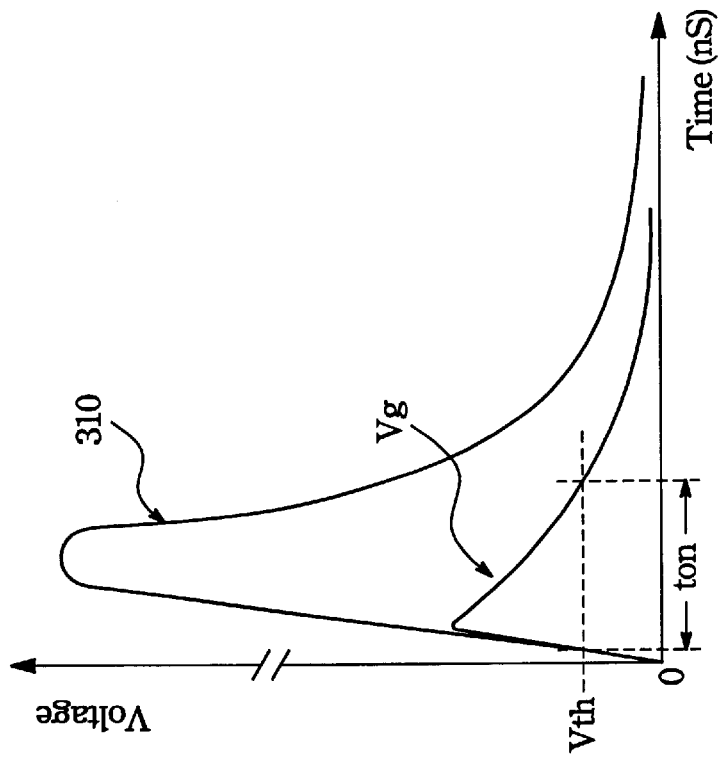
FIG. 7A is a schematic diagram of the typical voltage waveforms in the time domain for the gate-coupled ESD protection circuit in accordance with the present invention.

Referring to FIG. 7A, the typical voltage waveforms in the time domain for the present invention in the ESD-stress condition are shown, where an ESD voltage is attached to the input pad 10 and the gate of NMOS Mn1 (referring to FIG. 6 can be still coupled with a voltage waveform to turn on the NMOS Mn1. In the normal operating condition with high-speed input signal, the sharp rising edge of the input signal may still generate a transient voltage to the gate of NMOS Mn1 through the parasitical drain-to-gate overlaped capacitance (Cgd) in the MOS device. But, such parasitic Cgd is much small as comparing to the Cn. So the coupled transient voltage (due to the parasitic Cgd) on the NMOS Mn1 is very small, which is much smaller than the threshold voltage of the NMOS Mn1 device. Therefore, the NMOS Mn1 is still kept off when the IC is in the normal operating conditions with input signals having sharp rising edge. Then, referring to the FIG. 7B, the typical voltage waveforms for this design in the normal operating condition with high-speed input signal are shown. The gate voltage Vg of the NMOS Mn1 is below its threshold voltage Vth. The ESD-protection device NMOS Mn1 can be guaranteed to be off during the normal operating conditions even with a high-speed input signal.

Figure 8:
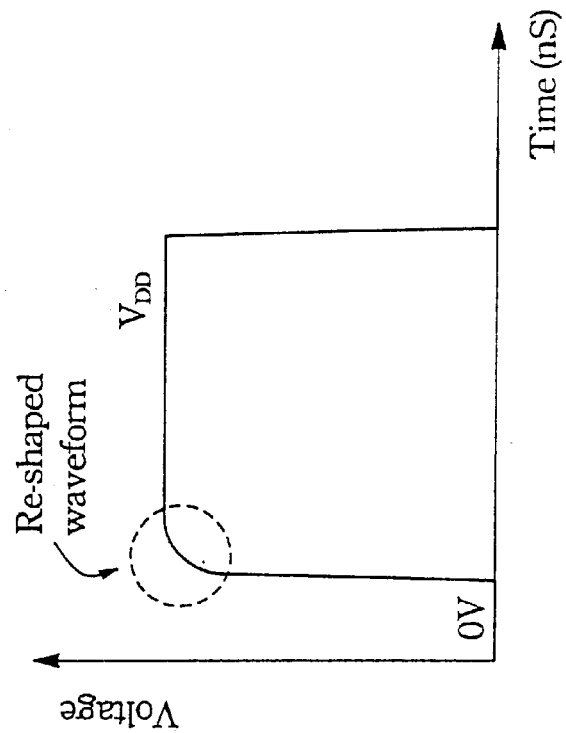
FIG. 8A is a schematic diagram of a typical input overshooting voltage waveform in the normal operating condition with high-speed input signal for the gate-coupled ESD protection circuit in accordance with the prior art.
FIG. 8B is a schematic diagram of a typical voltage waveform on the input pad with the gate-coupled ESD protection circuit and an overshooting input signal in accordance with the present invention.
Figure 8:
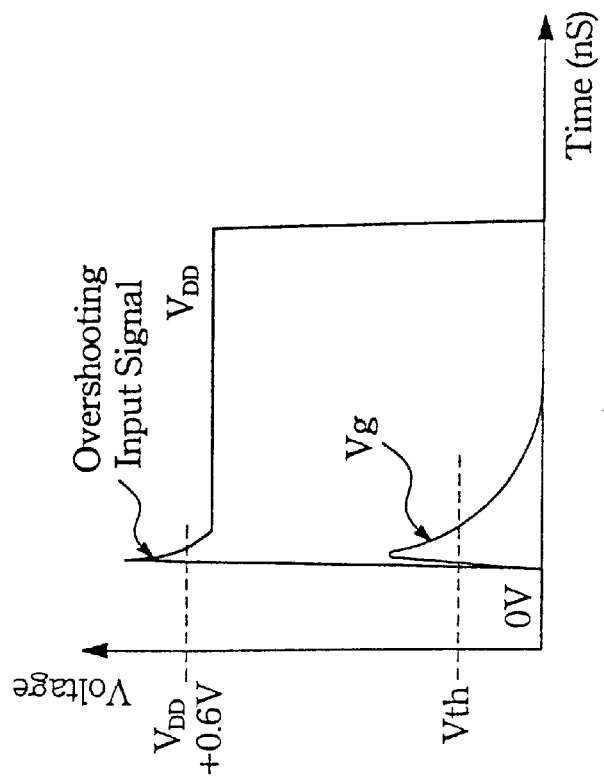

Besides, the present invention also provides another advantage to re-shape the overshooting voltage waveform of the input signal. Due to the impedance mismatching, the input signal often has serious overshooting voltage waveform in the high-speed applications. Please refer to the FIG. 8A, a typical input overshooting voltage waveform is shown, which is attached to the input pad 10 in the FIG. 6. When the overshooting level of the input signal is greater than $V_{DD}$+0.6V (0.6V is the diode cut-in voltage), the overshooting input signal will arrive at the cathode of the diode Dp1(referring to FIG. 6). Therefore, the overshooting input signal is coupled to the gate of NMOS Mn1 through the capacitor Cn, wherein the capacitor Cn is connected from the cathode of the diode Dp1 to the gate of NMOS Mn1. The overshooting voltage level is greater than $V_{DD}$ but much smaller than the ESD voltage level of several thousands volts. The gate of NMOS Mn1 is coupled with some voltage level which is slightly greater than the threshold voltage Vth of NMOS Mn1. Therefore the NMOS Mn1 is slightly turned on by the overshooting input signal and to automatically re-shape the input signal. This mechanism causes a waveform-shaping result on the overshooting input signal as the voltage waveform shown in the FIG. 8B. Thus, the present invention also provides a dynamic termination to re-shape the overshooting input signal for high-speed applications.

Figure 9:
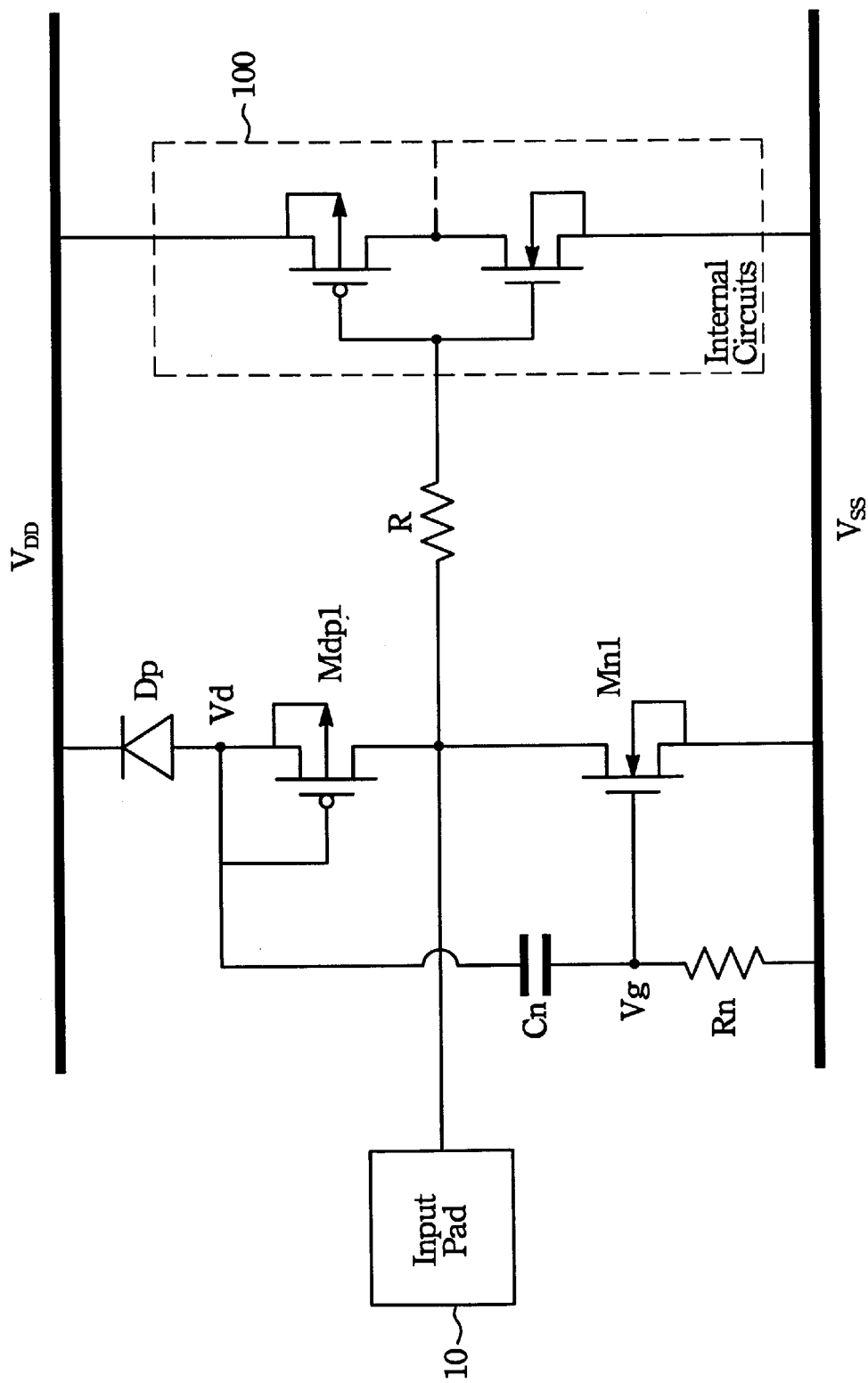
FIG. 9 is a schematic diagram of a modification for the gate-coupled ESD protection circuit without transient leakage in accordance with the present invention.

Based on the design concept of the present invention, some modified embodiments are provided as follow. Please refer to FIG. 9, a PMOS device Mdp1 is used to replace the diode Dp1 in FIG. 6 to perform the same function. The source of the PMOS Mdp1 is coupled to the anode of the diode Dp, and coupled to the capacitor Cn and the gate of the PMOS Mdp1. The drain of the PMOS Mdp1 is coupled to the drain of the NMOS Mn1. The bulk (namely the substrate) of the PMOS Mdp1 is electrically coupled to the source of the PMOS Mdp1.

Figure 10:
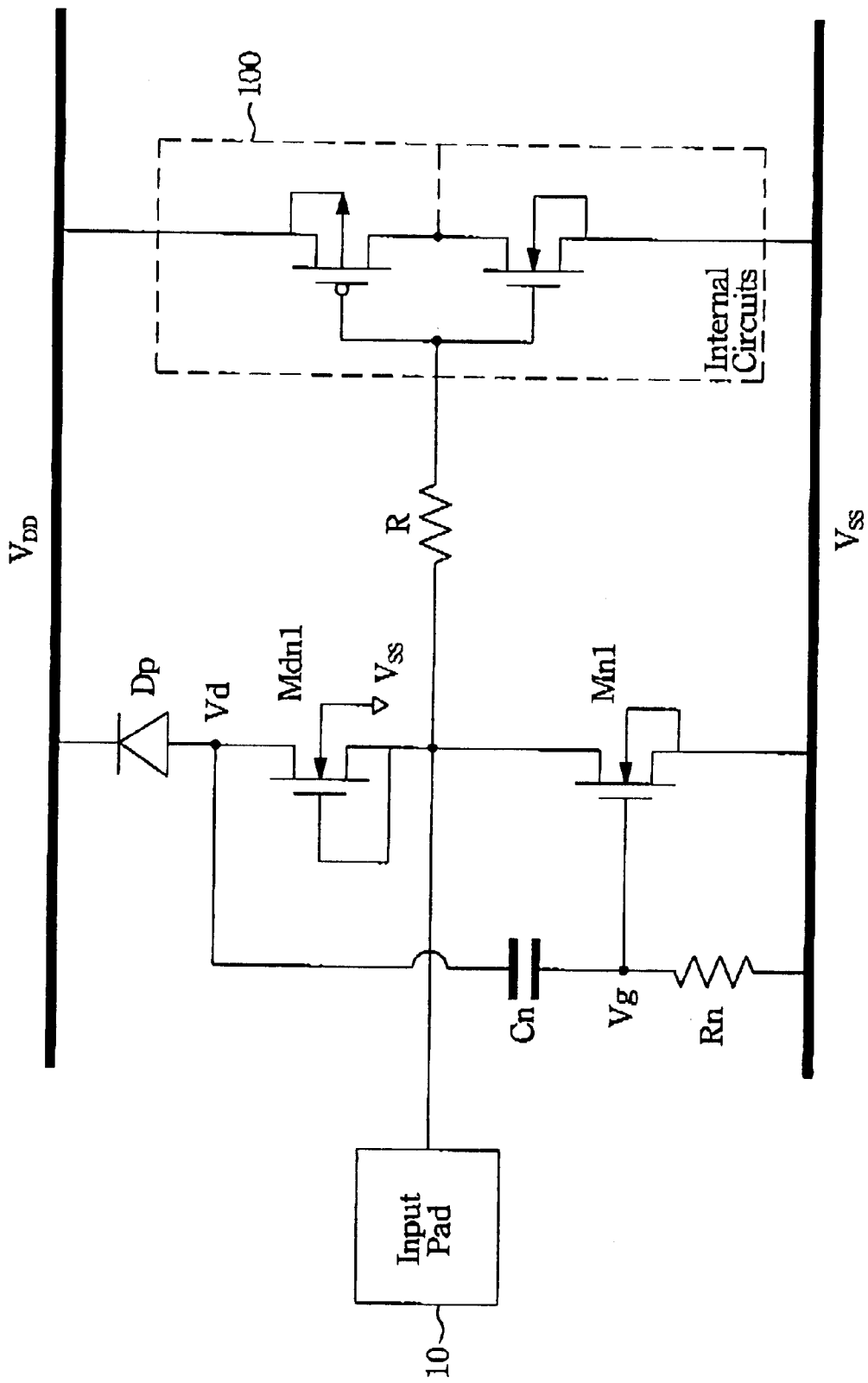
FIG. 10 is a schematic diagram of a modification for the gate-coupled ESD protection circuit without transient leakage in accordance with the present invention.

Please refer to FIG. 10, for another embodiment of the present invention, a NMOS device Mdn1 is used to replace the diode Dp1 in FIG. 6 to perform the same function. A drain of the NMOS Mdn1 is coupled to the anode of the diode Dp, and the gate of the NMOS Mdn1 is coupled to the drain of the NMOS Mn1 through the source of the NMOS Mdn1. The bulk(substrate) of the NMOS Mdn1 is electrically coupled to the power line $V_{SS}$.

Figure 11:
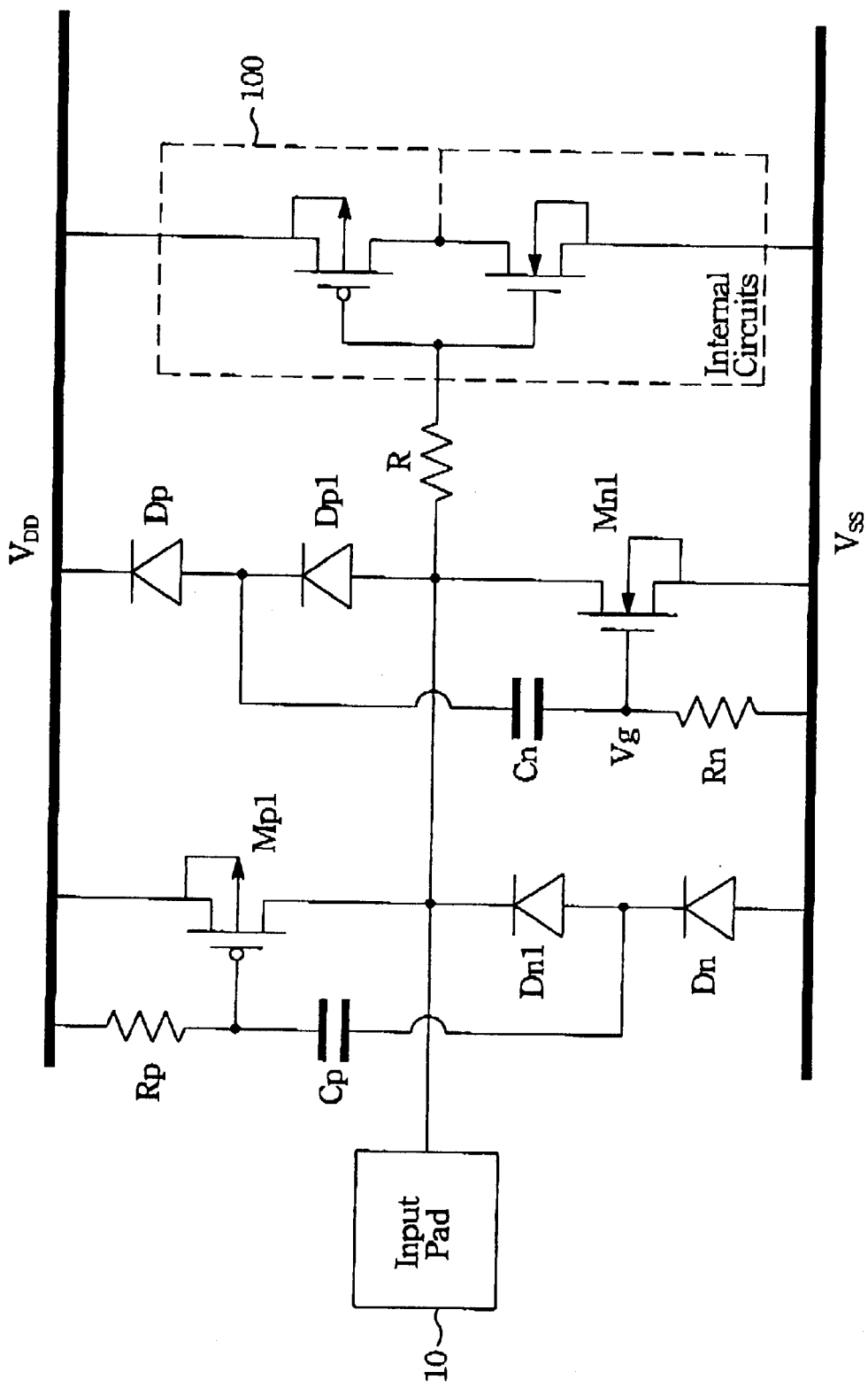
FIG. 11 is a schematic diagram of a modification for the gate-coupled ESD protection circuit without transient leakage in accordance with the present invention.

Please refer to the FIG. 11, the design concept of present invention is applied to both NMOS Mn1 and PMOS Mp1 of the input ESD protection circuit. The extra diodes Dn and Dn1 are used to avoid the ESD-protection PMOS Mp1 being triggered on by the sharp falling edge of the input signal. The cathode of the diode Dn1 is coupled to the drain of the PMOS Mp1, and the anode of the Dn1 is coupled to the cathode of the diode Dn, and coupled to the gate of the PMOS Mp1 through a capacitor Cp. The anode of the diode Dn is coupled to the power line $V_{SS}$. gate of the PMOS Mp1 is coupled to the power line $V_{DD}$ through a resistor Rp, and the source ofthe PMOS Mp1 is also coupled to the power line $V_{DD}$. Besides, the drain of the PMOS Mp1 is coupled to the internal circuits 100 through the resistor R, and coupled to the input pad 10. The internal circuits 100 is coupled to the power line $V_{DD}$ and the power line $V_{SS}$ for power supply. For the ESD device NMOS Mn1, the anode of the diode Dp1 is coupled to the drain of the NMOS Mn1, and the cathode of the Dp1 is coupled to the anode of the diode Dp, and coupled to the gate of the NMOS Mn1 through the capacitor Cn. The cathode of the diode Dp is coupled to the power line $V_{DD}$. The gate of the NMOS Mn1 is coupled to the power line $V_{SS}$ through the resistor Rn, and the source of the NMOS Mn1 is also coupled to the power line $V_{SS}$. Besides, the drain of the NMOS Mn1 is coupled to the internal circuits 100 through the resistor R, and coupled to the drain of the PMOS Mp1.

Figure 12:
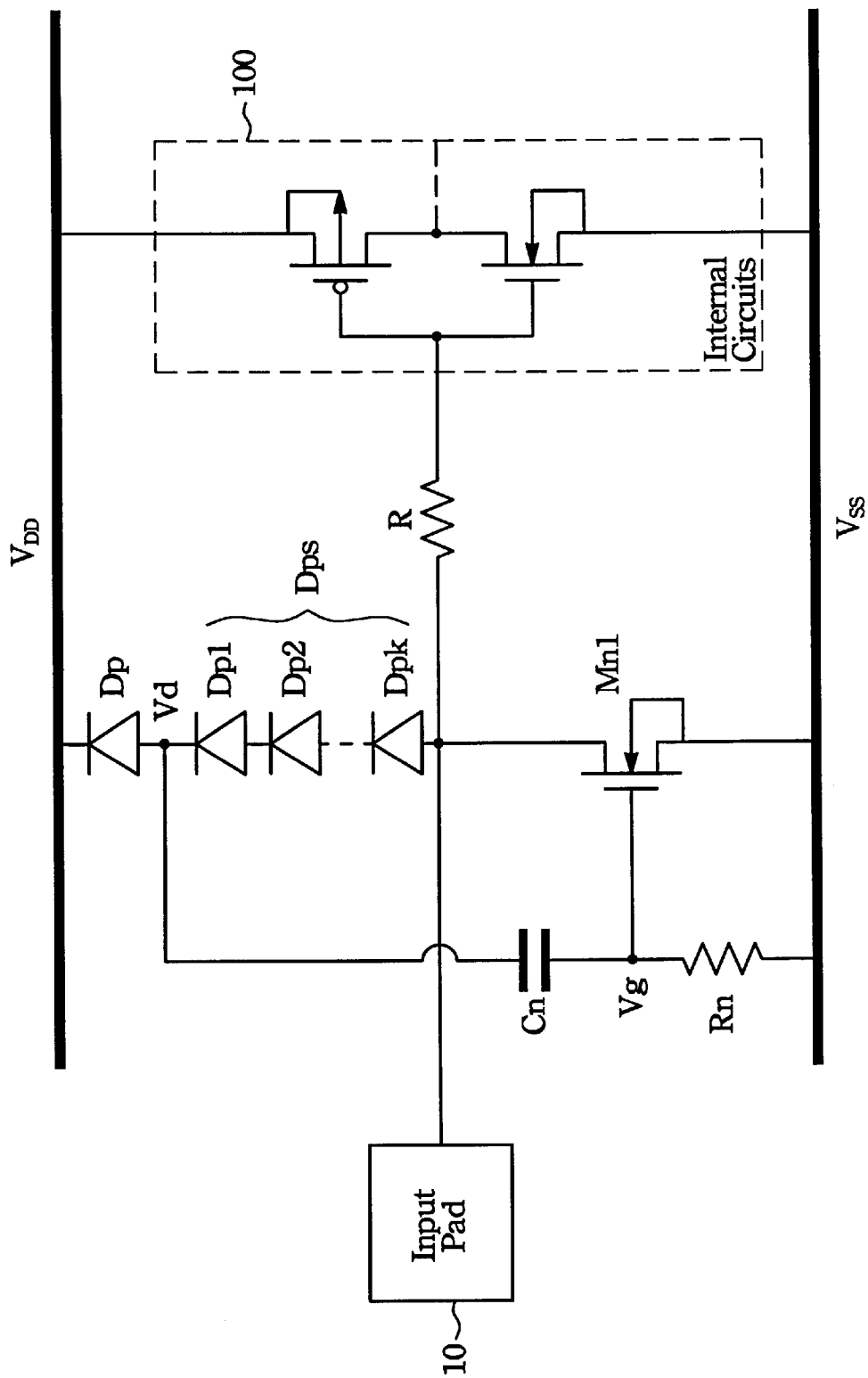
FIG. 12 is a schematic diagram of a modification for the gate-coupled ESD protection circuit without transient leakage in accordance with the present invention.

The ESD-protection PMOS Mp1 is designed to be triggered on by the negative ESD voltage on the input pad 10 to bypass the ESD current form the input pad 10 to the power line $V_{DD}$, because the negative ESD voltage on the input pad 10 can couple some negative voltage to the gate of the PMOS Mp1 through the capacitor Cp. This is a complementary design for the input ESD protection circuit with this present invention to clamp the ESD-stress voltages across from the input pad 10 to the power line $V_{SS}$ or the $V_{DD}$. If the input signal has an undershooting voltage waveform when the IC is in the normal operating conditions, the undershooting input signal can be also re-shaped by the Mp1 device. Referring to FIG. 12, another modified design according to resent invention is used to control the re-shape voltage level of the overshooting input signal waveform. There are a plurality of diodes (Dp1, Dp2 . . . , and Dpk) added between the input pad 10 and the diode Dp, they provide a voltage-blocking level of 0.6×k volts between the input pad 10 and the diode Dp. Wherein the plurality of diodes (Dp1, Dp2 . . . , and Dpk) are serial coupled, and comprise a series diode Dps. The anode of the series diode Dps is coupled to the drain of the NMOS Mn1, and the cathode of the Dp1 is coupled to the anode of the diode Dp, and coupled to the gate of the NMOS Mn1 through the capacitor Cn. The cathode of the diode Dp is coupled to the power line $V_{DD}$. The gate of the NMOS Mn1 is coupled to the power line $V_{SS}$ through the resistor Rn, and the source of the NMOS Mn1 is also coupled to the power line $V_{SS}$. Besides, the drain of the NMOS Mn1 is coupled to the internal circuits 100 through the resistor R, and coupled to the input pad 10. The internal circuits 100 is coupled to the power line $V_{DD}$ and the power line $V_{SS}$ for power supply. When the input signal at the input pad 10 has an overshooting voltage level greater than $V_{DD}$+(0.6×k) volts, the NMOS Mn1 can be turned on to re-shape the overshooting input signal. In the ESD-stress conditions, the ESD voltage of several thousands volts is much greater than the voltage level of $V_{DD}$+(0.6×k) volts, so the cathode of the series diode Dps has a voltage level as that of the ESD voltage level on the input pad 10. The NMOS Mn1 is therefore turned on by the gate-coupled voltage through the capacitor Cn on its gate to bypass the ESD current from the input pad 10 to the power line $V_{SS}$.

Figure 13:
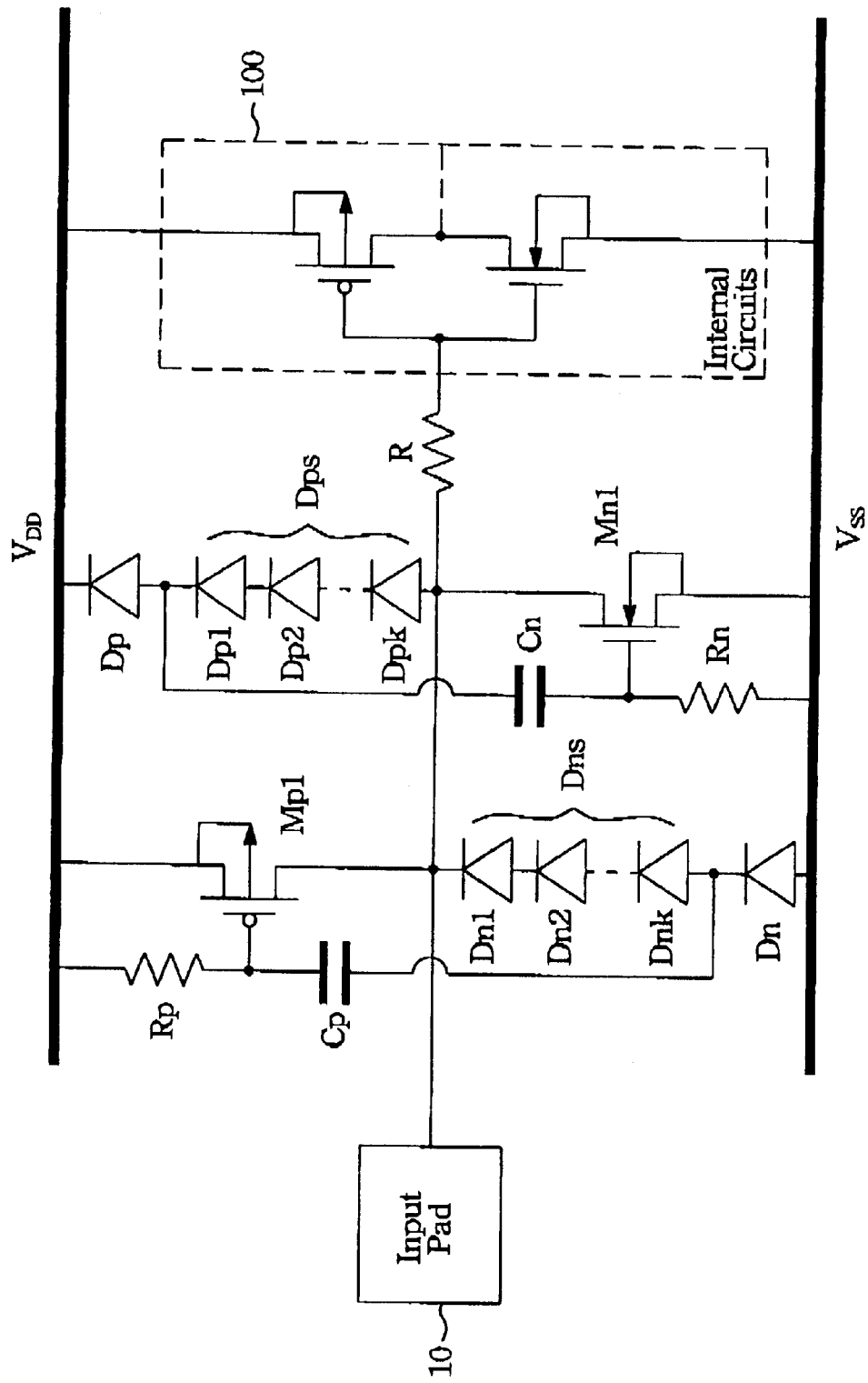
FIG. 13 is a schematic diagram of a modification for the gate-coupled ESD protection circuit without transient leakage in accordance with the present invention.

Please referring to FIG. 13, it is also another modified design according to present invention for the complementary gate-coupled ESD protection circuit with both overshooting and undershooting re-shape function. The arrangement is similar to the above embodiment in FIG. 11. Wherein the plurality of diodes (Dp1, Dp2 . . . , and Dpk) comprise the series diode Dps, is used to replace the diode Dp1 in FIG. 11. In addition, a plurality of diodes (Dn1, Dn2 . . . , and Dnk) comprise a series diode Dns, is also used to replace the diode Dn1. The series diode Dps and Dns are used to control the re-shape voltage level of the undershooting and overshooting input signal waveforms.

Figure 14:
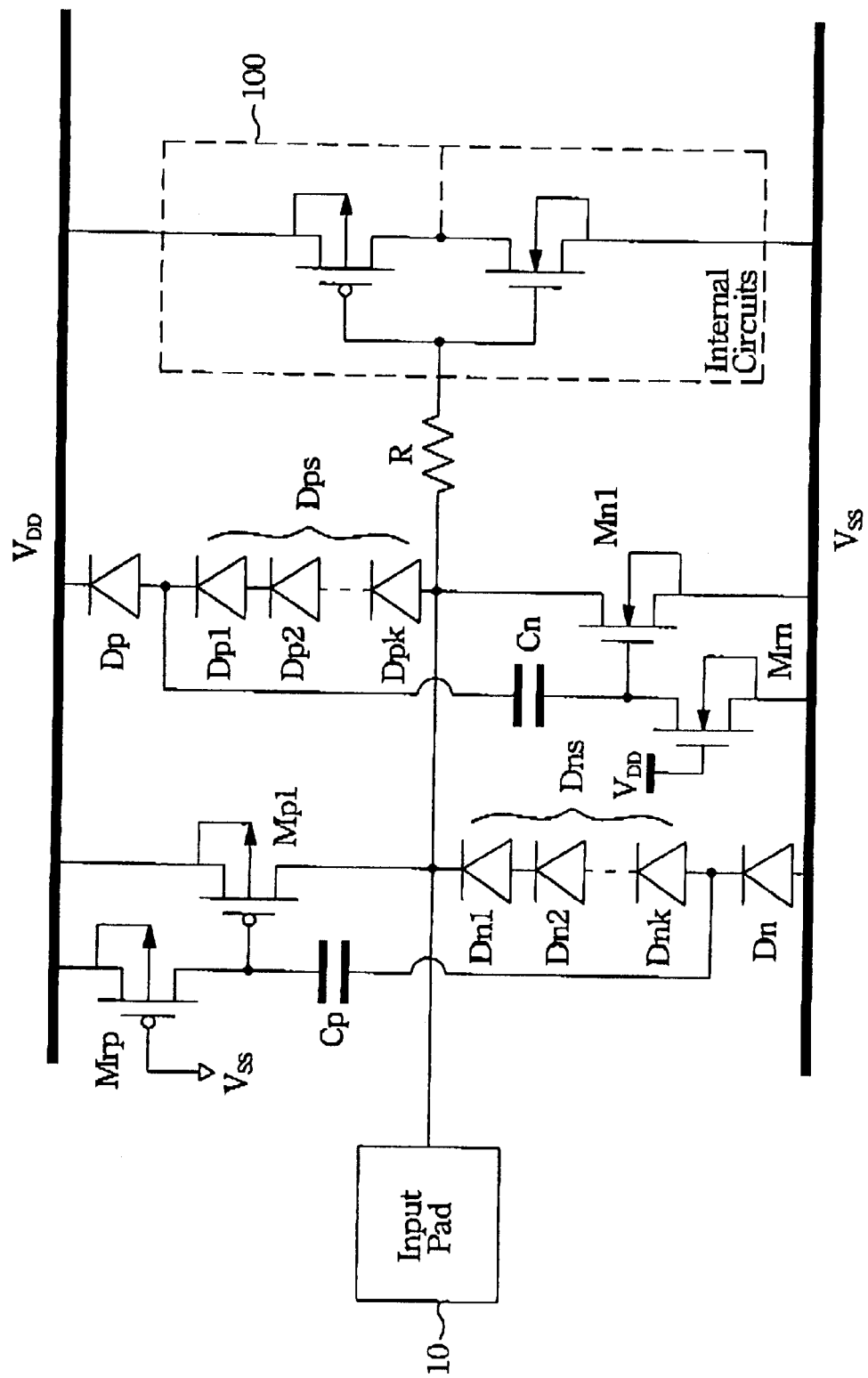
FIG. 14 is a schematic diagram of a modification for the gate-coupled ESD protection circuit without transient leakage in accordance with the present invention.

Referring to FIG. 14, a modified design according to present invention for the complementary gate-coupled ESD protection circuit is shown. Wherein the resistor Rn in FIG. 13 can be replaced by a NMOS device Mrn, and the resistor Rp in FIG. 13 can be replaced by a PMOS device Mrp. The gate of the NMOS Mrn is coupled to the power line $V_{DD}$, and the source of the NMOS Mrn is coupled to another power line $V_{SS}$. The drain of the NMOS Mrn is coupled to the gate of the NMOS Mn1 and the capacitor Cn. Besides, The gate of the PMOS Mrp is coupled to the power line $V_{SS}$, and the source of the PMOS Mrp is coupled to another power line $V_{DD}$. The drain of the PMOS Mrp is coupled to the gate of the PMOS Mp1 and the capacitor Cp.

As can be appreciated from the above disclosure, the present invention provides the following advantages: For example, the present invention can provide a solution to practically overcome the leakage issue of the gate-coupled ESD protection circuit in IC's due to the high-speed input signal with sharp rising/falling edge which often triggers on the gate-coupled ESD protection circuit and makes the voltage waveform of the input signal seriously degraded when the IC is in the normal operating conditions. The above issue limits the application of the gate-coupled technique for input ESD protection in the IC's with high-speed input signals. Besides, the present invention also provides another advantage to re-shape the overshooting or undershooting voltage waveform of the input signal. Due to the impedance mismatching, the input signal often has serious overshooting or undershooting voltage waveform in the high-speed applications. However, by using this invention, the gate-coupled technique can become still suitable for applying in the input ESD protection circuits in the IC's even with overshooting or undershooting high-speed input signals.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An apparatus of preventing integrated circuits from interfering by electrostatic-discharge (ESD), wherein said apparatus comprises:

an internal circuit coupled with said first power line and said second power line;

an input pad coupled to said internal circuit for inputting signals to said internal circuit;

a first voltage bias circuit coupled to said first power line for biasing said first voltage bias circuit to said second power line, comprising at least one diode coupled in series, and said at least one diode comprises a first serial diode, wherein an anode of said first serial diode is coupled to said input pad, and a cathode of said first serial diode is coupled to said first power line;

a first voltage clamp circuit coupled to said second power line for clamping potential level through said first voltage clamp circuit, comprising a first transistor device, wherein a source of said first transistor device coupled to said second power line, and a drain of said first transistor device coupled to said anode of said first serial diode;

a second voltage bias circuit coupled to said second power line for biasing said first voltage bias circuit to said first power line; and a second voltage clamp circuit coupled to said second voltage bias circuit and said first power line for clamping potential level through said second voltage clamp circuit.

2. The apparatus according to claim 1, wherein said first voltage clamp circuit, further comprises:

a capacitor device, wherein a gate of said first transistor device coupled to said cathode of said first serial diode through said capacitor device; and a resistor device, wherein said gate of said first transistor device coupled to said second power line through said resistor device.

3. The apparatus according to claim 1, wherein said first voltage clamp circuit, further comprises:

a capacitor device, wherein a gate of said first transistor device coupled to said cathode of said first serial diode through said capacitor device; and a third transistor device, wherein said gate of said first transistor device coupled to a drain of said third transistor device, and a gate of said third transistor device coupled to said first power line, a source of said third transistor device coupled to said second power line.

4. An apparatus of preventing integrated circuits from interfering by electrostatic-discharge (ESD), connected between an internal circuit and an input pad, said internal circuit coupled to a first power line and a second power line, said input pad inputting signals to said internal circuit, said apparatus comprising:

a first transistor device, wherein a source of said first transistor device coupled to said second power line, and a drain of said first transistor device coupled to said input pad;

a voltage clamp circuit, coupled to a second power line for clamping voltage level of a gate of said first transistor device; and a voltage bias circuit, comprising a first diode and a voltage bias circuit subassembly, wherein a cathode of said first diode coupled to said first power line, an anode of said first diode coupled to a first end of said voltage bias circuit subassembly and said voltage clamp circuit, and a second end of said voltage bias circuit subassembly coupled to said drain of said first transistor device for substantially preventing the overshooting inputting signals triggering said first transistor device.

5. The apparatus according to claim 4, wherein said voltage clamp circuit further comprises:

a capacitor device, wherein said gate of said first transistor device coupled to said first end of said voltage bias circuit subassembly through said capacitor device; and a resistor device, wherein said gate of said first transistor device coupled to said second power line through said resistor device.

6. The apparatus according to claim 5, wherein said voltage bias circuit subassembly further comprises at least one diode coupled in series, an anode of said at least one diode coupled to said drain of said first transistor device, a cathode of said at least one diode coupled to said capacitor device.

7. The apparatus according to claim 5, wherein said voltage bias circuit subassembly further comprises a second transistor, wherein a source and a gate of said second transistor couple to said anode of said first diode and said capacitor device, and a drain of said second transistor couples to said drain of said first transistor, and a substrate of said second transistor couples to said source of said second transistor.

8. The apparatus according to claim 5, wherein said voltage bias circuit subassembly further comprises a third transistor, wherein a source and a gate of said third transistor couple to said drain of said first transistor, and a drain of said third transistor couples to said anode of said first diode and said capacitor device, and a substrate of said third transistor couples to said second power line.

9. The apparatus according to claim 4, wherein said voltage clamp circuit further comprises:

a capacitor device, wherein said gate of said first transistor device coupled to said first end of said voltage bias circuit subassembly through said capacitor device; and a forth transistor device, wherein said gate of said first transistor device couples to a drain of said forth transistor device, and a gate of said forth transistor device couples to said first power line, and a source of said forth transistor device couples to said second power line.

10. The apparatus according to claim 9, wherein said voltage bias circuit subassembly further comprises at least one diode coupled in series, an anode of said at least one diode coupled to said drain of said first transistor device, a cathode of said at least one diode coupled to said capacitor device.

11. The apparatus according to claim 9, wherein said voltage bias circuit subassembly further comprises a second transistor, wherein a source and a gate of said second transistor couple to said anode of said first diode and said capacitor device, and a drain of said second transistor couples to said drain of said first transistor, and a substrate of said second transistor couples to said source of said second transistor.

12. The apparatus according to claim 9, wherein said voltage bias circuit subassembly further comprises a third transistor, wherein a source and a gate of said third transistor couple to said drain of said first transistor, and a drain of said third transistor couples to said anode of said first diode and said capacitor device, and a substrate of said third transistor couples to said second power line.

13. An apparatus of preventing integrated circuits from interfering by electrostatic-discharge (ESD), connected between an internal circuit and an input pad, said internal circuit coupled to a first power line and a second power line, said input pad inputting signals to said internal circuit, said apparatus comprising:

a first transistor device, wherein a source of said first transistor device coupled to said second power line, and a drain of said first transistor device coupled to said input pad;

a first voltage clamp circuit, coupled to a second power line for clamping voltage level of a gate of said first transistor device;

a first voltage bias circuit, comprising a first diode and a first voltage bias circuit subassembly, wherein a cathode of said first diode coupled to said first power line, an anode of said first diode coupled to a first end of said first voltage bias circuit subassembly and said first voltage clamp circuit, and a second end of said first voltage bias circuit subassembly coupled to said drain of said first transistor device for substantially preventing the overshooting inputting signals triggering said first transistor device;

a second transistor device, wherein a source of said second transistor device coupled to said first power line, and a drain of said second transistor device coupled to said input pad;

a second voltage clamp circuit, coupled to a first power line for clamping voltage level of a gate of said second transistor device; and a second voltage bias circuit, comprising a second diode and a second voltage bias circuit subassembly, wherein an anode of said second diode coupled to said second power line, a cathode of said second diode coupled to a first end of said second voltage bias circuit subassembly and said second voltage clamp circuit, and a second end of said second voltage bias circuit subassembly coupled to said drain of said second transistor device for substantially preventing the undershooting inputting signals triggering said first transistor device.

14. The apparatus according to claim 13, wherein said first voltage clamp circuit further comprises:

a first capacitor device, wherein said gate of said first transistor device coupled to said first end of said first voltage bias circuit subassembly through said first capacitor device; and a first resistor device, wherein said gate of said first transistor device coupled to said second power line through said first resistor device.

15. The apparatus according to claim 14, wherein said first voltage bias circuit subassembly further comprises at least one diode coupled in series, an anode of said at least one diode coupled to said drain of said first transistor device, a cathode of said at least one diode coupled to said first capacitor device.

16. The apparatus according to claim 12, wherein said first voltage clamp circuit further comprises:

a first capacitor device, wherein said gate of said first transistor device coupled to said first end of said first voltage bias circuit subassembly through said first capacitor device; and a third transistor device, wherein said gate of said first transistor device couples to a drain of said third transistor device, and a gate of said third transistor device couples to said first power line, and a source of said third transistor device couples to said second power line.

17. The apparatus according to claim 16, wherein said first voltage bias. Circuit subassembly further comprises at least one diode coupled in series, an anode of said at least one diode coupled to said drain of said first transistor device, a cathode of said at least one diode coupled to said first capacitor device.

18. The apparatus according to claim 13, wherein said second voltage clamp circuit further comprises:

a second capacitor device, wherein said gate of said second transistor device coupled to said first end of said second voltage bias circuit subassembly through said second capacitor device; and a second resistor device, wherein said gate of said second transistor device coupled to said first power line through said second resistor device.

19. The apparatus according to claim 18, wherein said second voltage bias circuit subassembly further comprises at least one diode coupled in series, a cathode of said at least one diode coupled to said drain of said second transistor device, an anode of said at least one diode coupled to said second capacitor.

20. The apparatus according to claim 13, wherein said second voltage clamp circuit further comprises:

a second capacitor device, wherein said gate of said second transistor device is coupled to said first end of said second voltage bias circuit subassembly through said second capacitor device; and a fourth transistor device, wherein said gate of said first transistor device couples to a drain of said forth transistor device, and a gate of said forth transistor device couples to said second power line, and a source of said forth transistor device couples to said first power line.

21. The apparatus according to claim 20, wherein said second voltage bias circuit subassembly further comprises at least one diode coupled in series, a cathode of said at least one diode coupled to said drain of said second transistor device, an anode of said at least one diode coupled to said second capacitor device.

* * * * *